United States Patent
Wang et al.

(10) Patent No.: US 9,660,183 B2
(45) Date of Patent: May 23, 2017

(54) INTEGRATION OF SPINTRONIC DEVICES WITH MEMORY DEVICE

(71) Applicant: GLOBALFOUNDRIES Singapore Pte. Ltd., Singapore (SG)

(72) Inventors: Chenchen Jacob Wang, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/052,796

(22) Filed: Feb. 24, 2016

(65) Prior Publication Data

US 2016/0254440 A1 Sep. 1, 2016

Related U.S. Application Data

(60) Provisional application No. 62/121,473, filed on Feb. 26, 2015.

(51) Int. Cl.
*H01L 43/12* (2006.01)
*H01L 43/08* (2006.01)
*H01L 27/22* (2006.01)

(52) U.S. Cl.
CPC ............ *H01L 43/12* (2013.01); *H01L 27/228* (2013.01); *H01L 43/08* (2013.01)

(58) Field of Classification Search
CPC ....................................................... H01L 43/12
See application file for complete search history.

(56) References Cited

U.S. PATENT DOCUMENTS

2010/0193888 A1* 8/2010 Gu .......................... H01L 43/08
257/421

OTHER PUBLICATIONS

Akio Fukushima et al., "Spin Dice: A Scalable Truly Random Number Generator Based on Spintronics", The Japan Society of Applied Physics, Jul. 2014, pp. 083001-1-083001-4, vol. 7, No. 8, IOP Publishing.
N. Locatelli et al., "Spin-torque Building Blocks", Nature Materials, Jan. 2014, pp. 11-20, vol. 13, Macmillan Publishers Limited.
I L Prejbeanu et al., "Thermally Assisted MRAMs: Ultimate Scalability and Logic Functionalities", Journal of Physics D: Applied Physics, Jan. 2013, pp. 1-16, vol. 46, No. 7, IOP Publishing.

(Continued)

*Primary Examiner* — Dung Le
(74) *Attorney, Agent, or Firm* — Horizon IP Pte. Ltd.

(57) ABSTRACT

A device and a method of forming a device are presented. A substrate is provided. The substrate includes circuit component formed on a substrate surface. Back end of line processing is performed to form an upper inter level dielectric (ILD) layer. The upper ILD layer includes a plurality of ILD levels. A plurality of magnetic tunneling junction (MTJ) stacks is formed in between adjacent ILD levels of the upper ILD layer. The plurality of MTJ stacks include a first MTJ stack having a first free layer, a first tunneling barrier layer and a first fixed layer. The first free layer is perpendicular to the first tunneling layer and fixed layer in the plane of the substrate surface. The plurality of MTJ stacks also include a second MTJ stack having a second free layer, a second tunneling barrier layer and a second fixed layer.

20 Claims, 12 Drawing Sheets

(56) References Cited

OTHER PUBLICATIONS

Dong-Sun Kim et al., "A Fully Integrated Sensor SoC with Digital Calibration Hardware and Wireless Transceiver at 24 GHz", Sensors, May 2013, pp. 6775-6793, vol. 13, No. 5, MDPI AG.

P. K. Muduli et al., "Intrinsic Frequency Doubling in a Magnetic Tunnel Junction-based Spin Torque Oscillator", Journal of Applied Physics, Oct. 2011, pp. 076102-1-076102-3, vol. 110, American Institute of Physics.

D. Houssameddine et al., "Spin-torque Oscillator Using a Perpendicular Polarizer and a Planar Free Layer", Nature Materials, Jun. 2007, pp. 447-453, vol. 6, Nature Publishing Group.

Zhongming Zeng et al., "High-Power Coherent Microwave Emission from Magnetic Tunnel Junction Nano-oscillators with Perpendicular Anisotropy", ACS Nano, Jun. 2012, pp. 6115-6121, vol. 6, No. 7, American Chemical Society.

Micro Magnetics, Inc., "SpinTJ Magnetic Sensors", "http://www.micromagnetics.com/products_mtj_f_s.html", retrieved online on Nov. 6, 2014, pp. 1-9, Micro Magnetics, Inc.

\* cited by examiner

INTEGRATION OF SPINTRONIC DEVICES WITH MEMORY DEVICE

CROSS-REFERENCE TO RELATED APPLICATION

This application claims the priority benefit of U.S. Provisional Application Ser. No. 62/121,473, filed on Feb. 26, 2015, which is herein incorporated by reference in its entirety.

BACKGROUND

A System on Chip (SoC) is a single chip which integrates all components of a computer or other electronic system on the same substrate. For example, a SoC may include various functional circuits such as a microprocessor, power management circuits, timing sources including oscillators, memory blocks including a selection of ROM, RAM, EEPROM and flash memory, and sensor blocks including magnetic field sensors.

Very often, different functional units are in discrete forms, i.e., each are standalone units manufactured separately by different manufacturers or different processes. Such discrete systems show the limitations of building small form factor solution and low power consumption which is required in today's modern society for mobile application as well as Internet of Things. One way to overcome the limitations is to develop integrated solutions on the same silicon-based substrate manufactured in the same process so that physical space taken by diverse functional modules and their interfaces can be much reduced by optimized design, and subsequently lower power consumption and better performance is possible with tighter integration and removal of unnecessary overhead.

Therefore, there is a need to improve chip integration process for reducing the time to market and at the same time achieving the production of smaller systems.

SUMMARY

Embodiments of the present disclosure generally relate to semiconductor device and method for forming a semiconductor device. In one embodiment, a method of forming a device is disclosed. A substrate is provided. The substrate includes circuit components formed on the substrate surface. Back end of line processing is performed to form an upper inter level dielectric (ILD) layer. The upper ILD layer comprises a plurality of ILD levels. A plurality of magnetic tunneling junction (MTJ) stacks is formed in between adjacent ILD levels of the upper ILD layer. The plurality of the MTJ stacks include a first MTJ stack having a first free layer, a first tunneling barrier layer and a first fixed layer. The first free layer is perpendicular to the first tunneling layer and fixed layer in the plane of the substrate surface. The plurality of the MTJ stacks also include a second MTJ stack having a second free layer, a second tunneling barrier layer and a second fixed layer.

In another embodiment, a device is presented. The device includes a substrate having circuit component disposed over a substrate surface. An upper inter level dielectric (ILD) layer is disposed on the substrate. The upper ILD layer includes a plurality of ILD levels. A plurality of magnetic tunneling junction (MTJ) stacks are disposed in between adjacent ILD levels of the upper ILD layer. The plurality of MTJ stacks include a first MTJ stack having a first free layer, a first tunneling barrier layer and a first fixed layer. The first free layer is perpendicular to the first tunneling layer and fixed layer in the plane of the substrate surface. The plurality of MTJ stacks also include a second MTJ stack having a second free layer, a second tunneling barrier layer and a second fixed layer.

These and other advantages and features of the embodiments herein disclosed, will become apparent through reference to the following description and the accompanying drawings. Furthermore it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments of the present disclosure generally relate to semiconductor devices. In one embodiment, the semiconductor devices are System on Chips (SoCs). For example, the SoCs may include, but not limited to, memory cells and one or more functional circuits such as sensors and/or oscillators/detectors integrated on the same substrate. The SoCs may be incorporated into or used with, for example, consumer electronic products, or relate to other types of devices.

In one embodiment, the memory cells and the one or more functional circuits integrated on the same substrate include magnetic tunneling junction (MTJ) elements. In such case, the memory cells are magnetoresistive memory cells and the functional circuit includes spintronic component. For example, the memory devices may be spin transfer torque magnetoresistive random access memory (STT-MRAM) devices integrated with spintronic device. Other suitable types of memory cells may also be useful. The MTJ element of the memory cell and the one or more functional circuits typically includes a fixed (pinned) magnetic layer and a free magnetic layer. The fixed (pinned) magnetic layer and the free magnetic layer are laminated such that a tunnel barrier film forms between the two magnetic layers. The magnetic orientation of the free magnetic layer flips by a direction or an opposite direction of electric currents exceeding a critical select current. The electrical resistance of the MTJ element changes corresponding to that of the magnetic orientation of the free magnetic layer relating to the fixed magnetic layer, which may be in either a parallel state or an anti-parallel state. Other suitable types of memory cells may also be useful.

Figure 1:
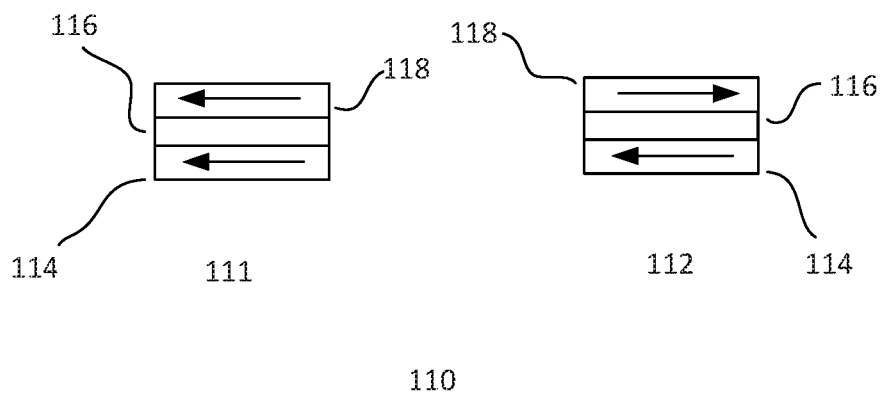
FIG. 1 shows a diagram of parallel state and anti-parallel state of a MTJ element.

FIG. 1 shows a simplified cross-sectional view of an embodiment of a MTJ element 110. The magnetization or magnetic orientations of the MTJ element 110 is configured to be in the horizontal direction. Horizontal direction, for example, refers to the direction along or parallel to the surface of a substrate. As shown, the magnetization lies in the plane of the substrate surface.

The MTJ element 110 includes a magnetically fixed (pinned) layer 114, a tunneling barrier layer 116 and a magnetically free layer 118. The magnetization or magnetic orientation of the fixed (pinned) layer 114 is fixed while the magnetization or magnetic orientation of the free layer 118 may be programmed to be in a first or same direction as the fixed (pinned) layer 114, or in a second or opposite direction as the fixed layer, depending on the direction of the write current. For example, as shown by structure 111, the magnetic direction of the free layer 118 is programmed to be in the first or parallel direction as the fixed (pinned) layer 114. The corresponding MTJ electrical resistance between the free layer 118 and the fixed (pinned) layer 114 in the parallel state is denoted as $R_P$. Structure 112 illustrates that the magnetization of the free layer 118 is programmed to be in a second or anti-parallel direction as the fixed (pinned) layer 114. The corresponding MTJ electrical resistance between the free layer 118 and the fixed (pinned) layer 114 in the anti-parallel state is denoted as $R_{AP}$. The resistance $R_{AP}$ is typically higher than resistance $R_P$.

Figure 2:
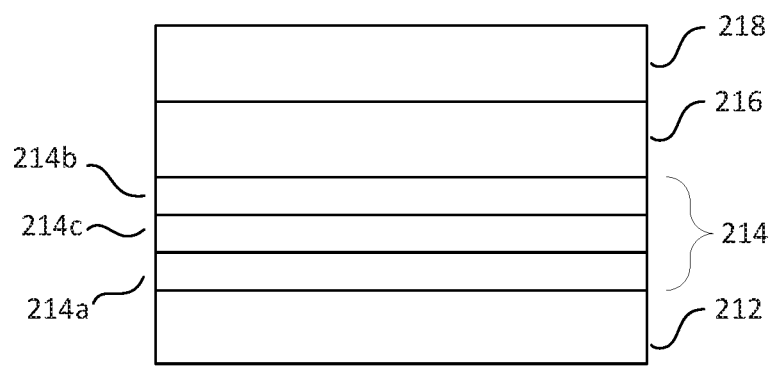
FIG. 2 shows a cross-sectional view of an embodiment of a MTJ stack.

FIG. 2 shows a simplified cross-sectional view of an embodiment of a MTJ stack 210 along a bitline direction (x-axis). The MTJ stack 210 is a stack of layers including a bias layer 212, a magnetically fixed (pinned) layer 214, a tunneling barrier layer 216 and a magnetically free layer 218. The layers forming the MTJ elements are sequentially formed on a seed layer (not shown). The seed layer, for example, enables a smooth growth of the subsequently formed layers in the desired crystallinity. The seed layer may be a nickel-based alloy, for example, NiFe or NiCr. Other suitable alloys, apart from nickel-based alloys, may also be useful. The thickness of the seed layer may be in the range of 1-5 nm. Other suitable thickness dimensions may also be useful.

The bias layer 212 is an antiferromagnetic (AFM) layer. For example, the AFM layer 212 may be PtMn or IrMn. The thickness of the bias layer may be in the range of 5-25 nm. Other suitable thickness dimensions may also be useful.

The fixed (pinned) layer 214 is disposed on the bias layer 212. The fixed (pinned) layer 214 may be a synthetic antiferromagnetic (SAF) layer. The SAF layer may include a first magnetic layer 214a, a second magnetic layer 214b and a coupling layer 214c. The first and second magnetic layers have opposite magnetizations and are separated by the coupling layer 214c. The first magnetic layer 214a is coupled to the bias layer 212. The coupling layer 214c is disposed on the first magnetic layer 214a and the second magnetic layer 214b is disposed on the coupling layer 214c. Since the magnetic layers are antiparallel coupled, a closure of the magnetic flux is formed within. As a result, stray magnetic field influences on the free layer 218 are minimized.

The magnetizations of the first and second magnetic layers are "pinned" via a direct exchange-bias coupling to the bias layer 212, so that the magnetizations of the first and second magnetic layers cannot flip (rotate) in the presence of an applied magnetic field. The magnetization or magnetic orientation in the second magnetic layer 214b closer to the free layer 218 acts as a fixed reference to the free layer 218.

The first and second magnetic layers of the SAF layer 214 may be an alloy magnetic layer or a multilayer. For example, the magnetic layers 214a and 214b may be a cobalt-iron-boron (CoFeB) alloy or a cobalt-iron (CoFe) alloy. The first magnetic layer 214a may be thicker than the second magnetic layer 214b in order to cancel the stray field acted upon the free layer 218.

The coupling layer 214c may be a non-magnetic conductor. For example, the coupling layer 214c may be a ruthenium (Ru) layer. The thickness of the Ru layer may be up to about 1.8 nm. The Ru layer may be chosen so that there is enough AFM exchange bias exists between the first and second magnetic layers 214a and 214b. As a result, the magnetization orientation is stabilized in opposite directions.

The tunneling barrier layer 216 is disposed on the fixed (pinned) layer 214. The tunneling barrier layer is a non-magnetic and electrically insulating layer. The tunneling barrier layer 216 may be metal oxide, for example, MgO or $Al_2O_3$. Other metal oxides suitable for used in the MTJ element may also be useful.

The magnetic free layer 218 is disposed on the tunneling barrier layer 216. The magnetic free layer 218 may be CoFeB, CoFe or NiFe based composite material, or a combination thereof in a layered manner, with a thickness of up to about 5 nm. Other suitable thickness dimensions may also be useful.

The MTJ stack may include other layers as well. Other suitable configurations or materials of MTJ stack may also be useful. As shown in FIGS. 1-2, the MTJ stacks are bottom pinned stacks. For example, in a bottom pinned stack, the fixed layer is disposed below the free layer. In other embodiments, the MTJ stacks may be top pinned MTJ stacks. For example, the fixed layer may be disposed above the free layer.

Figure 3:
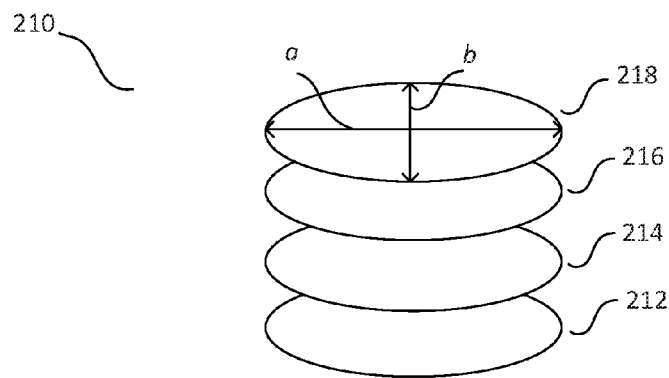
FIG. 3 shows an exploded top view of various layers of a MTJ stack.

FIG. 3 shows an exploded top view of the various layers of the MTJ stack 210 of FIG. 2. The top view shows that the MTJ stack 210 has an elongated shape. As shown, the various layers of the MTJ stack adopt the same elongated shape of the bottom layer, i.e., bias layer. The elongated shape, in one embodiment, is an elliptical shape having a long axis (easy axis) a and a short axis (hard axis) b. The elongated shape induces a magnetic anisotropy (shape anisotropy) to always keep the magnetization of the layers of the MTJ stack along the long axis a. This is particularly important as the magnetization orientation of the free layer is sensitive to the shape. Providing other elongated shape other than the elliptical shape as shown is also useful.

Figure 4:
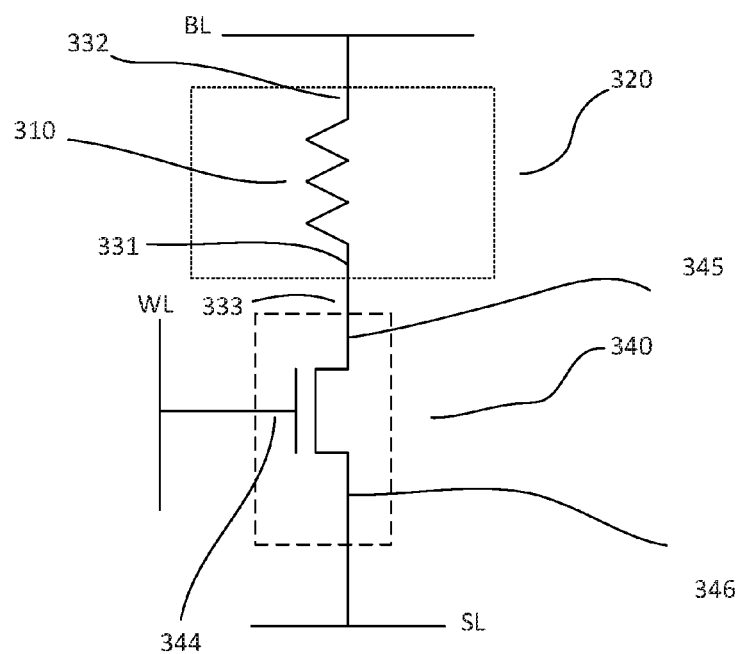
FIG. 4 shows a schematic diagram of an embodiment of a memory cell.

FIG. 4 shows a schematic diagram of an embodiment of a memory cell or device 300. The memory cell is a non-volatile memory cell. For example, the memory cell may be a magnetoresistive memory cell. In one embodiment, the memory cell is a Spin Transfer Torque-Magnetoresistive Random Access Memory (STT-MRAM) cell. Other suitable types of memory cells may also be useful. The memory cell includes a storage unit 320 and a cell selector unit 340. The storage unit 320 is coupled to the cell selector unit 340. For example, the storage unit and cell selector unit are coupled at node 333 of the memory cell. Storage unit 320, in one embodiment, includes a storage element 310. The storage element, for example, may be resistive storage elements. In one embodiment, the storage element is a magnetoresistive memory element, such as a MTJ storage element. The MTJ element may be defined similar to that described in FIGS. 2 and 3. Other suitable types of MTJ or storage elements may also be useful.

The storage element 310 includes first and second electrodes 331 and 332. The first electrode 331, for example, may be a bottom electrode while the second electrode 332 may be a top electrode. Other configurations of electrodes may also be useful. In one embodiment, the top electrode 332 of the storage element 310 is electrically connected to a bitline (BL). The bottom electrode 331 of the storage element 310 is connected to the first cell node 333.

The cell selector unit 340 includes a selector for selecting the memory cell. The selector, for example, may be a select transistor. In one embodiment, the select transistor is a metal oxide semiconductor (MOS) transistor. In one embodiment, the select transistor is a n-type MOS transistor. The select transistor includes first and second source/drain (S/D) terminals 345 and 346 and a gate or control terminal 344. The S/D terminals, for example, are heavily doped regions with first polarity type dopants, defining the first polarity type transistor. For example, in the case of a n-type transistor, the S/D terminals are n-type heavily doped regions. Other types of transistors or selectors may also be useful.

In one embodiment, the first terminal of the cell selector and first terminal of the storage unit 310 are commonly coupled at the node 333. For example, the first S/D terminal of the cell selector is coupled to the bottom electrode of the storage unit. The second terminal of the cell selector is coupled to a source line (SL). As for the gate terminal, it is coupled to a wordline WL.

Figure 5:
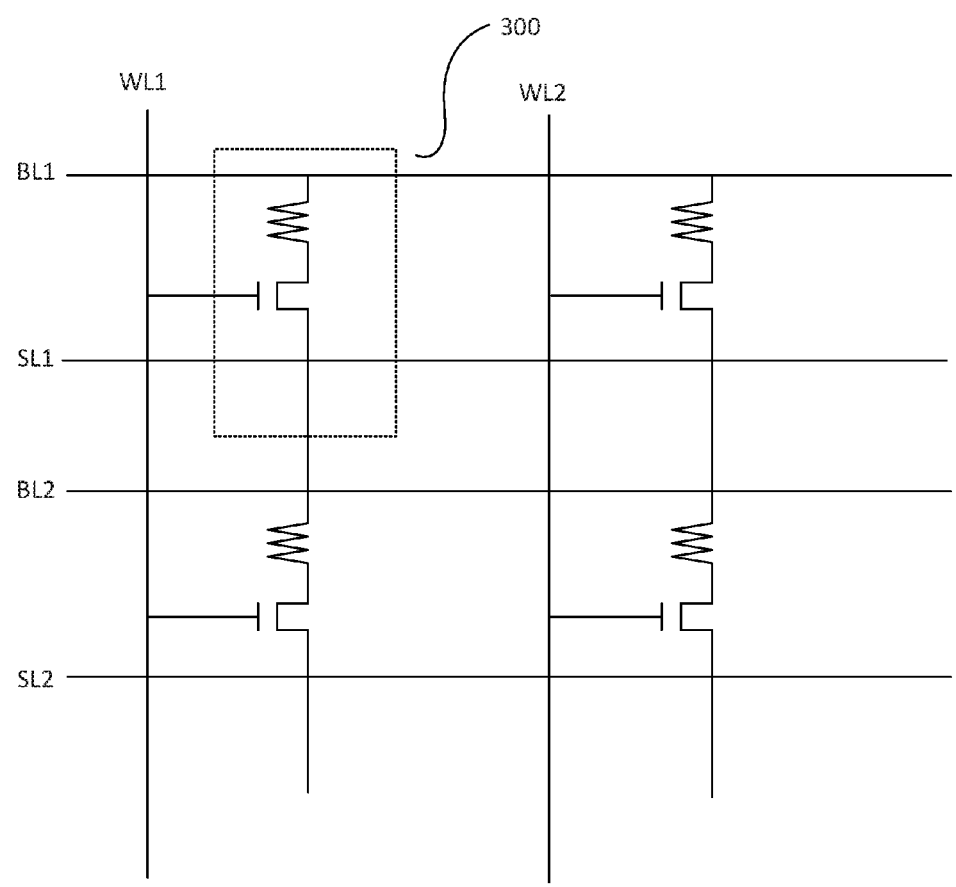
FIG. 5 shows a schematic diagram of an embodiment of a portion of a memory array.

FIG. 5 shows a schematic diagram of an embodiment of a memory array 400. The array includes a plurality of memory cells 300 interconnected. The memory cells may be similar to those described in FIG. 4. For example, the memory cells are MRAM cells, such as STT-MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2) while memory cells of a column are interconnected by a bitline (BL1 or BL2). A S/D terminal is coupled to a source line (SL1 or SL2). Other suitable cell configurations may also be useful. Although the array is illustrated as a 2×2 array, it is understood that arrays of other sizes may also be useful.

Figure 6:
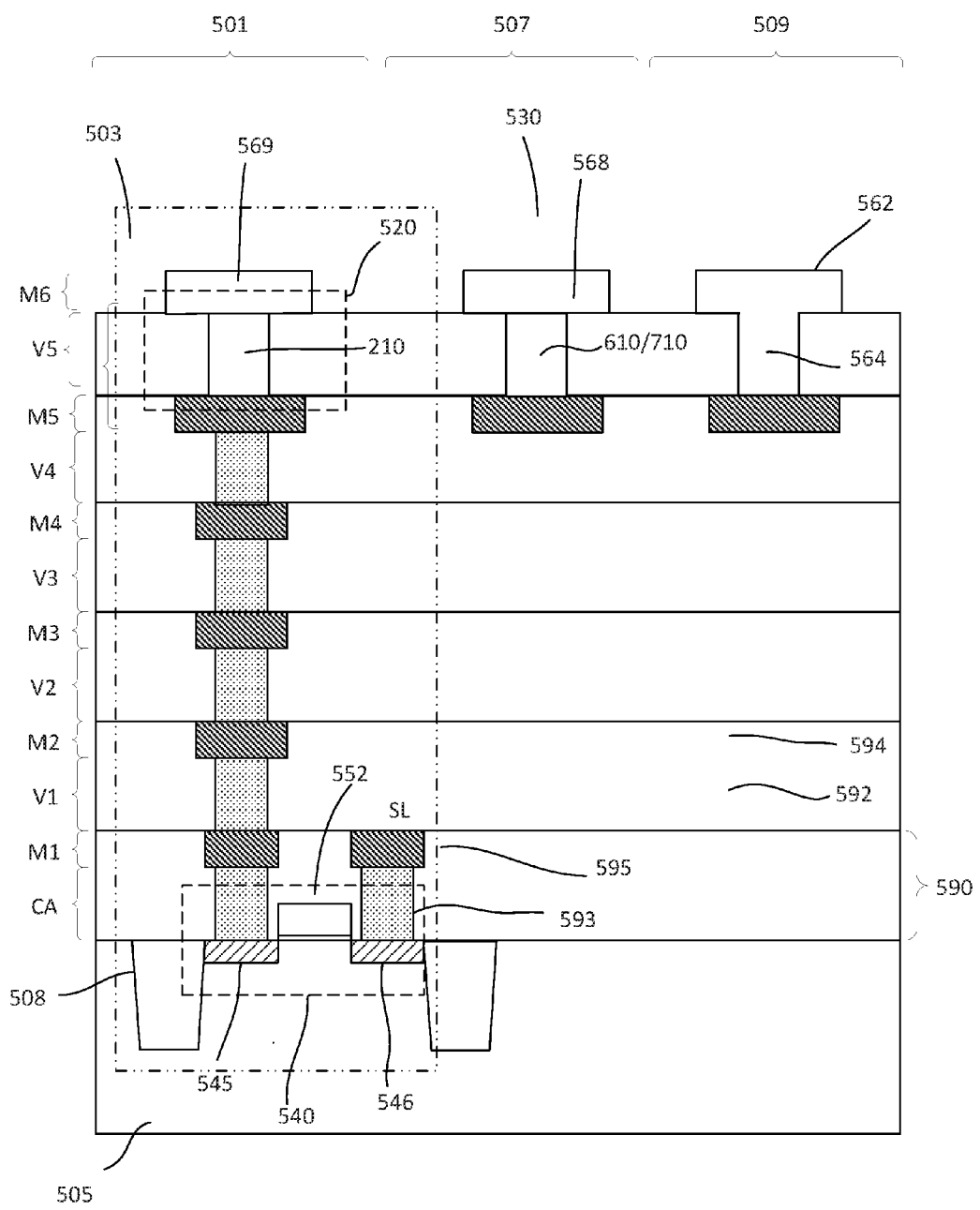
FIG. 6 shows a cross-sectional view of an embodiment of a device.

FIG. 6 shows a cross-sectional view of an embodiment of a device 500. The cross-sectional view, for example is along a second or bitline direction of the device. The device, as shown, includes a memory cell 503 integrated with one or more functional circuits 530. The memory cell, for example, may be a NVM memory cell and the one or more functional circuits include spintronic components. The memory cell, in one embodiment, is a magnetoresistive NVM cell, such as a STT-MRAM cell. The memory cell, for example, is similar to that described in FIG. 4. Common elements may not be described or described in detail.

The memory cell is disposed on a substrate 505. For example, the memory cell is disposed in a cell region 501 of the substrate. The cell region may be part of an array region. For example, the array region may include a plurality of cell regions. The same substrate may include device region 507 which accommodates other functional devices, such as magnetic sensors and/or magnetic oscillators/detectors as well as other types of device regions 509, such as logic regions, including low voltage (LV) and intermediate voltage (IV) device regions. Other types of regions (not shown), such as but not limited to high voltage (HV) device region, may also be provided.

The substrate, for example, is a semiconductor substrate, such as a silicon substrate. For example, the substrate may be a lightly doped p-type substrate. Providing an intrinsic or other types of doped substrates, such as silicon-germaniun (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front end of line (FEOL) processing is performed on the substrate. The FEOL process, for example, forms n-type and p-type devices or transistors on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

Isolation regions 508, for example, serve to isolate different device regions. The isolation regions may be shallow trench isolation (STI) region. To form STI regions, trenches are formed and filled with isolation material. A planarization process, such as chemical mechanical polishing (CMP) is performed to remove excess dielectric material, forming isolation regions. Other types of isolation regions may also be useful. The isolation regions are provided to isolate device regions from other regions.

Device wells, for example, serve as bodies of p-type and n-type transistors. Device wells are doped wells. Second type doped device wells serve as bodies of first type transistors. For example, p-type device wells serve as bodies of n-type transistors and n-type device wells serve as bodies of p-type transistors. Isolation wells may be used to isolate device wells from the substrate. The isolation wells are deeper than the device wells. For example, isolation wells encompass the device wells. The isolation wells are first type doped wells. For example, n-type isolation wells are used to isolate p-type device wells. Separate implants may be employed to form different doped device wells and isolation wells using, for example, implant masks, such as photoresist masks. The wells, for example, are formed after forming isolation regions.

Gates of transistors are formed on the substrate. For example, layers of the gate 552, such as gate dielectric and gate electrode are formed on the substrate and patterned to form the gates. The gate dielectric may be a silicon oxide layer while the gate electrode layer may be polysilicon. The gate electrode may be doped, for example, to reduce sheet resistance. Other types of gate dielectric and gate electrode layers may also be useful. The gate dielectric layer may be formed by thermal oxidation and the gate electrode layer may be formed by chemical vapor deposition (CVD). Separate processes may be performed for forming gate dielectrics of the different voltage transistors. This is due to, for example, different gate dielectric thicknesses associated with the different voltage transistors. For example, HV transistor will have a thicker gate dielectric than a LV transistor.

The gate layers are patterned by, for example, mask and etch techniques. For example, a patterned photoresist mask may be provided over the gate layers. For example, a photoresist layer is formed over the gate layers and lithographically exposed by using a reticle. The mask layer is developed, forming a patterned mask with the desired pattern of the reticle. To improve lithographic resolution, an anti-reflective coating (ARC) layer may be provided between the gate layer and resist mask layer. An anisotropic etch, such as a reactive ion etch (RIE), is used to pattern the gate layers to form the gates using the patterned mask layer.

Doped contact regions 545 and 546, such as source/drain (S/D) regions and well or substrate taps are formed in exposed active regions of the substrate after forming the gates. The contact regions are heavily doped regions. Depending on the type of transistor and well tap, the contact regions may be heavily doped n-type or p-type regions. For n-type transistors, S/D regions are heavily doped n-type regions and for p-type transistors, S/D regions are heavily doped p-type regions. For well taps, they are the same dopant type as the well.

A S/D region may include lightly doped diffusion (LDD) and halo regions. A LDD region is a lightly doped region with first polarity type dopants while the halo region is a lightly doped region with second polarity type dopants. For example, the halo region includes p-type dopants for a n-type transistor while the LDD region includes n-type dopants for n-type transistors. The halo and LDD regions extend under the gate. A halo region extends farther below the gate than a LDD region. Other configurations of LDD, halo and S/D regions may also be useful.

Dielectric spacers (not shown) may be provided on the gate sidewalls of the transistors. The spacers may be used to facilitate forming transistor halo, LDD and transistor S/D regions. For example, spacers are formed after halo and LDD regions are formed. Spacers may be formed by, for example, forming a spacer layer on the substrate and anisotropically etching it to remove horizontal portions, leaving the spacers on sidewalls of the gates. After forming the spacers, an implant is performed to form the S/D regions. Separate implants may be employed to form different doped regions using, for example, implant masks, such as photoresist mask. Well taps of the same dopant type as S/D regions are formed at the same time.

As shown, the FEOL processing forms a cell region isolated by an isolation region 508, such as a STI region. The cell region is for a memory cell. Isolation regions may be provided to isolate columns of memory cells or to isolate the memory cell region from other device regions. Other configurations of isolation regions may also be useful. The cell region may include a cell device well (not shown). The cell device well, for example, serves as a body well for a transistor of the memory cell. The device well may be doped with second polarity type dopants for first polarity type transistors. The device well may be lightly or intermediately doped with second polarity type dopants. In some cases, a cell device isolation well (not shown) may be provided, encompassing the cell device well. The isolation well may have a dopant type which has the opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example, the cell device well may be an array well. The cell device isolation well may serve as the array isolation well. Other configurations of device and isolation wells may also be useful. Other device regions of the device may also include device and/or device isolation wells.

The memory cell includes a cell selector unit 540 and a storage unit 520. The FEOL forms the cell selector in the cell region. The cell selector unit 540 includes a selector for selecting the memory cell. The selector, for example, may be a select transistor. In one embodiment, the select transistor is a metal oxide semiconductor (MOS) transistor. The transistor, as shown, includes first and second source/drain (S/D) regions 545 and 546 formed in the substrate and a gate 552 disposed on the substrate between the S/D regions. The S/D regions, for example, are heavily doped regions with first polarity type dopants, defining the first type transistor. For example, in the case of a n-type transistor, the S/D regions are n-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or wordline direction. The gate conductor forms a common gate for a row of memory cells.

As discussed, a S/D region may include LDD and halo regions (not shown). Dielectric spacers (not shown) may be provided on the gate sidewalls of the transistors to facilitate forming transistor halo, LDD and transistor S/D regions. It is understood that not all transistors include LDD and/or halo regions.

After forming the cell selector unit and other transistors, back end of line (BEOL) processing is performed. The BEOL process includes forming interconnects in interlevel dielectric (ILD) layers 590. The interconnects connect the various components of the IC to perform the desired functions. An ILD layer includes a metal level 594 and a contact level 592. Generally, the metal level includes conductors or metal lines 595 while the contact level includes contacts 593. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as RIE, may also be employed to form metal lines.

A device may include a plurality of ILD layers or levels. For example, x number of ILD levels may be provided. As illustrated, the device includes 6 ILD levels (x=6). Other number of ILD levels may also be useful. The number of ILD levels may depend on, for example, design requirements or the logic process involved. A metal level of an ILD level may be referred to as M, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 dielectric. The first metal level M1 and CA may be referred as a lower ILD level.

The process continues to form additional ILD layers. For example, the process continues to form upper ILD layers or levels. The upper ILD levels may include ILD level 2 to ILD level x. For example, in the case where x=6 (6 levels), the upper levels include ILD levels from 2 to 6, which includes M2 to M6 and V1 to V5. The number of ILD layers may depend on, for example, design requirements or the logic process involved. The upper ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an upper ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M6) may have different design rules, such as critical dimension (CD), than the lower ILD levels. For example, Mx may have a larger CD than metal levels M1 to Mx−1 below. For example, the uppermost metal level may have a CD which is 2× or 6× the CD of the metal levels below.

As shown, S/D contacts are disposed in the CA level. The S/D contacts are coupled to the first and second S/D regions of the select transistor. Other S/D contacts to other S/D regions of transistors may also be provided. The CA level may include a gate contact (not shown) coupled to the gate of the select transistor. The gate contact may be disposed in another cross-section of the device. The gate contact may be coupled to a wordline WL (not shown) in M1. Providing the WL in other metal levels may also be useful. The contacts may be tungsten contacts. Other types of contacts may also be useful. Other S/D and gate contacts for other transistors may also be provided.

As described, metal lines are provided in M1. The metal lines are coupled to the S/D contacts. In one embodiment, a SL is coupled to the second S/D region of the select transistor. As for the first S/D contact, it may be coupled to contact pad or island in M1. The contact pads provide connections to upper ILD levels. The metal lines or pads may be formed of copper or copper alloy. Other types of conductive material may also be useful.

As for the upper ILD, for example, from 2 to 6, they include contacts in the via level and contact pads/metal lines in the metal level. For example, the contacts and contact pads provide connection from M6 to the first S/D region of the select transistor.

The storage unit 520 of the memory cell is disposed in a via level of the dielectric layer 590. For example, the storage unit is disposed in between metal levels M5 and M6. The storage unit includes a storage stack having various layers. The storage stack may be a magnetic storage stack. The magnetic storage stack is, for example, a MTJ stack 210, similar to the one described in FIGS. 2 and 3. Common elements may not be described or described in detail. The MTJ stack forms a storage unit of a MRAM cell.

A top electrode may be provided over the MTJ stack while and a bottom electrode may be provided below the MTJ stack. The bottom electrode is coupled to a contact pad in the metal level below. For example, the bottom electrode is coupled to a contact pad in M5. This provides connections of the MTJ stack to the first S/D region of the cell select transistor. As for the top electrode, it is exposed at the top of the dielectric layer.

A metal line 569 is disposed over the MTJ stack 210 in M6. The metal line, for example, serves as a bitline BL. As shown, the top of the MTJ stack is coupled to the BL. This provides connection of the first S/D region of the cell selector to the storage unit and from the storage unit to the BL. It is understood that, although SL and WL are disposed in M1 while BL is disposed in M6, other configurations of lines may also be useful. For example, SL, WL and BL may be disposed in other metal levels. Generally, metal lines disposed along the same direction may be disposed in the same level. Providing lines which are disposed along the same direction in different levels may also be useful.

As described, the same substrate 505 includes a device region 507 which accommodates other functional devices 530, such as magnetic field sensors and/or magnetic oscillators/detectors. The functional device 530 disposed in the region 507, in one embodiment, includes a MTJ stack 610. The MTJ stack 610, similar to the one described in FIG. 2, may be configured to function as a microwave oscillator or detector. For example, a steady-state voltage oscillation is produced when direct current (dc) travels through a magnetized magnetic multilayer of the MTJ stack. As a result, the MTJ stack can be used as a microwave oscillator, the output of which can be used for various RF applications. In another embodiment, an RF oscillation signal can be fed into the MTJ stack, and the output dc voltage can be modulated by the oscillation frequency. As a result, the MTJ stack can be used as an RF detector.

In one embodiment, the MTJ stack 610 is modified to obtain an aspect ratio (AR=long axis a/short axis b) which is suitable for the MTJ stack 610 to function as a microwave oscillator or detector. The modified MTJ stack 610 may retain the configurations and thicknesses of the layers used in the MTJ stack 210. For example, similar to the MTJ stack 210, the modified MTJ stack 610 includes a bias layer, a magnetically fixed (pinned) layer, a tunneling barrier layer and a magnetically free layer.

Figure 7:
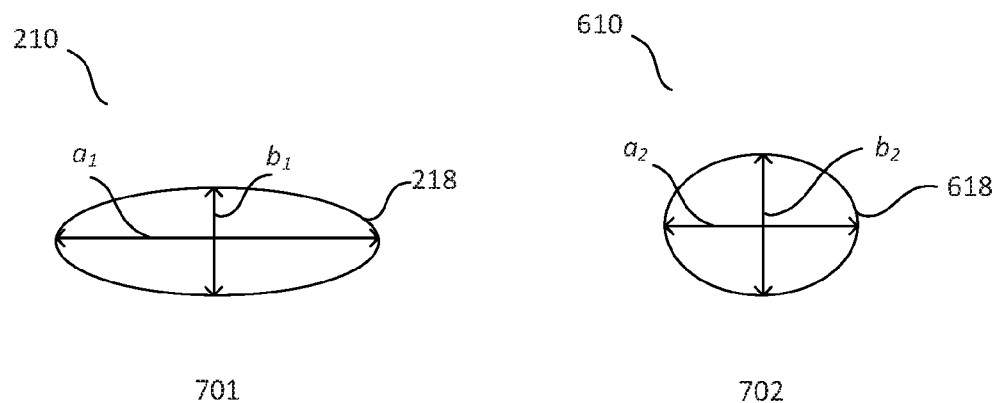
FIG. 7 shows a top view of a MTJ stack and a top view of an embodiment of a modified MTJ stack.

FIG. 7 shows a top view 701 of the MTJ stack 210 of FIG. 2 configured to function as a storage unit of the memory cell and a top view 702 of the modified MTJ stack 610 configured to function as a microwave oscillator or detector. The top views show that the size of the free layer 618 of the modified MTJ stack 610 is different from the size of the free layer 218 of the MTJ stack 210. As shown, the free layer 218 has a first long axis $a_1$ and a first short axis $b_1$, while the free layer 618 has a second long axis $a_2$ and a second short axis $b_2$. The length of the first long axis $a_1$ is different from the length of the second long axis $a_2$. Similarly, the length of the second short axis $b_1$ is different from the length of the second short axis $b_2$. As a result, the aspect ratio ($AR_1$=long axis $a_1$/short axis $b_1$) of the free layer 218 can be different from the aspect ratio ($AR_2$ long axis $a_2$/short axis $b_2$) of the free layer 618. For example, the first short axis $b_1$ of the free layer 218 may be in the range of about 50-200 nm, which produces an aspect ratio ($AR_1$) of about 2 to 3. On the other hand, the second short axis $b_2$ of the free layer 618 may be in the range of about 40-200 nm, producing an aspect ratio ($AR_2$) of about 1 to 3, which is suitable for RF detector/oscillator applications.

In one embodiment, only the free layer of the MTJ stack 610 is being modified to have a different aspect ratio than the free layer of the MTJ stack 210. In other embodiments, the entire MTJ stack 610 may be modified to have a different aspect ratio than the MTJ stack 210.

The MTJ stacks 210 and 610, in one embodiment, are formed on the same substrate with the MTJ stacks 210 and 610 configured in different size and aspect ratio as described above such that MTJ stack 210 serves as the storage unit for the memory cell, while MTJ stack 610 serves as a microwave oscillator or detector. During operation, current $I_1$ may be applied to the MTJ stack 210 which functions as a STT-MRAM, whilst additional magnetic field (H) and current of different magnitude $I_2$ may be applied to the modified MTJ stack 610, depending on the desired applications. The current $I_2$ may be a dc current or RF current, depending on the desired applications. The additional magnetic field (H) may be generated by metal lines having magnetic cladding within the metal levels. The metal lines having magnetic cladding may be fabricated within metal levels where the STT-MRAM is located. In one embodiment, a sufficient distance, e.g., greater than 1 µm, is provided between the memory cell array and the oscillator or detector blocks for isolating the influence of the additional magnetic field.

A metal line 568 is disposed over the MTJ stack 610 in M6. The metal line serves as a RF oscillator input line for RF modules if the MTJ stack 610 is configured as a RF oscillator. The metal line, for example, is connected to a dc current source and to RF modules. On the other hand, the metal line serves as a sensing line for low frequency circuitry if the MTJ stack 610 is configured as a detector. The metal line, for example, is connected to a RF source and low frequency circuitry for reading the low frequency voltage.

In another embodiment, the functional device 530 disposed in the region 507 includes a MTJ stack 710. The MTJ stack 710, similar to the one described in FIG. 2 may be configured to function as a magnetic field sensor. The MTJ stacks 210 and 710, in one embodiment, are formed on the same substrate with the MTJ stacks 210 and 710 configured in different shape such that the MTJ stack 210 serves as the storage unit for the memory cell while MTJ stack 710 serves as magnetic field sensor as will be described below.

Figure 8A:
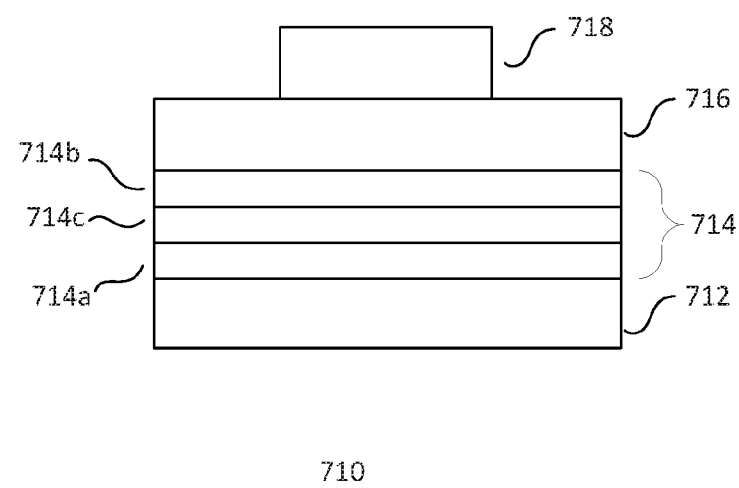
FIGS. 8a-8c show cross-sectional views and a top view of an embodiment of a MTJ stack.

FIG. 8a shows a simplified cross-sectional view of a MTJ stack 710 along bitline direction (x-axis). The MTJ stack 710, for example, is similar to that described in FIG. 2. As such, common elements may not be described or described in detail. In the interest of brevity, the description below primarily focuses on the difference between the MTJ stack 710 and 210.

Referring to FIG. 8a, the MTJ stack 710 is a stack of layers including a bias layer 712, a magnetically fixed (pinned) layer 714, a tunneling barrier layer 716 and a magnetically free layer 718. The fixed (pinned) layer may be a SAF layer. The SAF layer may include a first magnetic layer 714a, a second magnetic layer 714b and a coupling layer 714c. The first and second magnetic layers have opposite magnetizations and are separated by the coupling layer 714c. The layers forming the MTJ elements are sequentially formed on a seed layer (not shown).

As shown, the rest of the layers of the MTJ stack 710 have a substantially uniform length along the bitline direction (x-axis). The length of the free layer 718 along x-axis is shorter than the length of the rest of the layers of the MTJ stack 710.

Figure 8B:
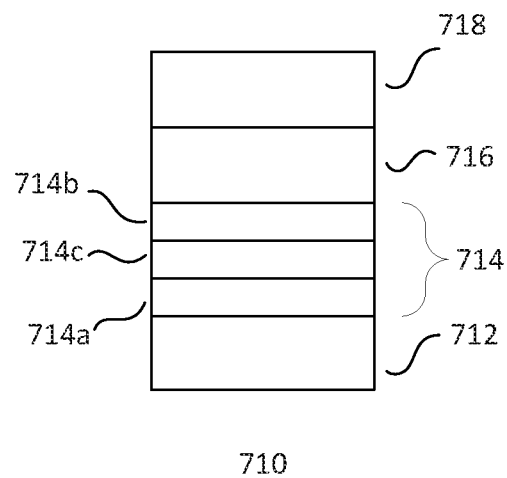

FIG. 8b shows a simplified cross-sectional view of the MTJ stack 710 of FIG. 8a along a wordline direction (z-axis). As illustrated in FIG. 8b, the rest of the layers of the MTJ stack 710 have a substantially uniform width along z-axis. The width of free layer 718 along z-axis is similar or smaller than the width of the rest of the layers of the MTJ stack 710.

Figure 8C:
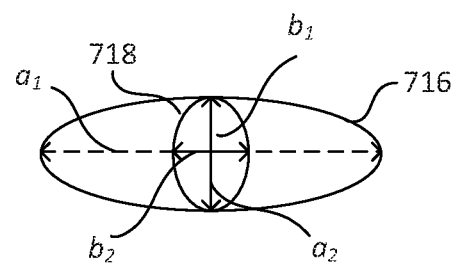

FIG. 8c shows a top view of the MTJ stack 710 of FIGS. 8a-8b. The top view shows that the free layer 718 and the tunneling barrier layer 716 of the MTJ stack 710 have an elongated shape. The rest of the layers of the MTJ stack 710 may also have the same elongated shape. The elongated shape, in one embodiment, is an elliptical shape having a long axis a and a short axis b, in one embodiment, the free layer 718 has an elliptical shape which is substantially the same as the elliptical shape of the tunneling barrier layer 716. The tunneling barrier layer 716 and the rest of the layers, including the fixed layer 714, have a first long axis $a_1$ and a first short axis $b_1$, and the free layer 718 has a second long axis $a_2$ and a second short axis $b_2$. The free layer 718, in one embodiment, is perpendicular to the tunneling barrier layer 716 and the rest of the layers, including the fixed layer 714, in the same plane. For example, the free layer 718 is rotated at about 90° with respect to the rest of the layers, such that the second long axis $a_2$ of the free layer 718 is perpendicular to the first long axis $a_1$ and aligned with the first short axis $b_1$ of the tunneling barrier layer 716. The second short axis $b_2$ of the free layer 718 is perpendicular to the first short axis $b_1$ and aligned with the first long axis $a_2$ of the tunneling barrier layer 716.

In one embodiment, the length of the first long axis $a_1$ is longer than the length of the second long axis $a_2$, as well as the length of the second short axis $b_2$. The length of the first short axis $b_1$ is longer than or the same as the length of the second long axis $a_2$. The length of the first short axis $b_1$ is also longer than the length of the second short axis $b_2$. As shown in FIG. 8c, the perimeter of the free layer 718 is within the perimeter of the rest of the layers of the MTJ stack 710, including the tunneling barrier layer 716 and fixed layer 714. For example, the free layer 718 is circumscribed by the rest of the layers of the MTJ stack 710, as viewed from the top.

The thickness of the layers of the MTJ stack 710 may be similar to the MTJ stack 210 of FIG. 2. Other suitable thicknesses of MTJ stack may also be useful.

Figure 9A:
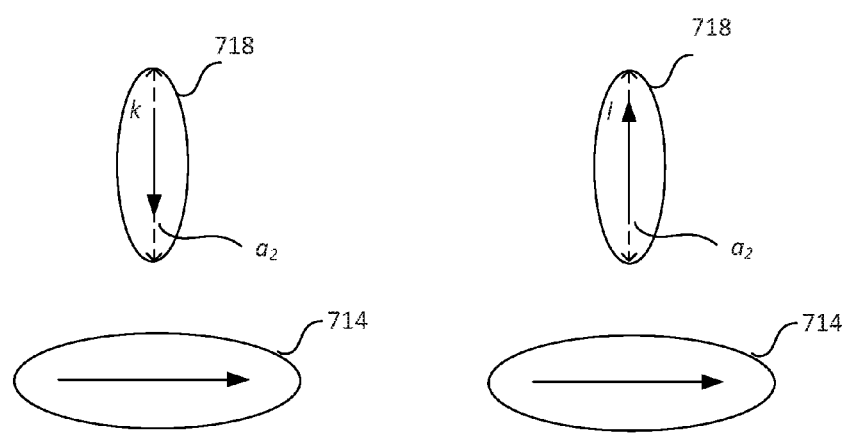
FIGS. 9a-9c show top views of free layer and fixed (pinned) layer of an embodiment of a MTJ stack.
Figures 9B, 9C:
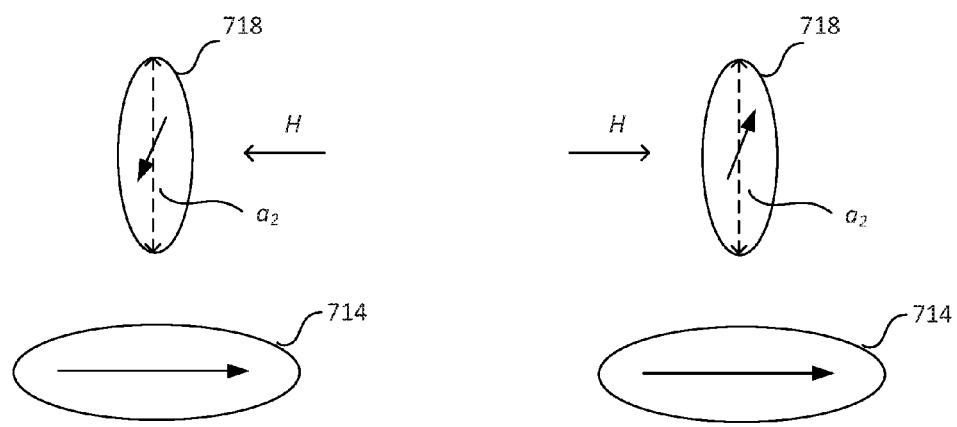

As described, the MTJ stack 710 of FIGS. 8a-8c are configured as a magnetic field sensor. FIGS. 9a-9c show top views of the free layer and fixed (pinned) layer of the MTJ stack 710. The in-plane magnetization of the free layer 718 has two stable states defined by the shape anisotropy of the layer. Referring to FIG. 9a, arrows k and l denote the two stable states, respectively, when an external magnetic field is not applied. The two stable states k and l equivalent in magnitude. The two stable states are aligned with the long axis $a_2$. Due to the orientation of the free layer 718 which is orthogonally aligned to the orientation of the fixed (pinned) layer 714, the resistance during either of the states is $R \approx 0.5(R_{high}+R_{low})$. $R_{high}$ denotes the electrical resistance when the magnetizations of the free layer and fixed layer are in the anti-parallel state, whereas $R_{low}$ is the electrical resistance when the magnetizations of the free layer and fixed layer are in the parallel state.

As shown in FIG. 9b, when a magnetic field H is applied to the left, the magnetization of the free layer 718 deviates from the second long axis $a_2$ and tilts to the left. FIG. 9c shows that when a magnetic field H is applied to the right, the magnetization of the free layer 718 tilts to the right, deviating from the second long axis $a_2$. Such deviation of the magnetization from the long axis of the free layer 718 allows the MTJ stack 710 to be used as a magnetic field sensor. For example, the MTJ stack 710 may be used to monitor the stray field around a MRAM array, enabling a robust MRAM operation. When used as a sensor, the magnetoresistance response of the MTJ stack 710 varies linearly as a function of magnetic field strength over a field range.

Referring back to FIG. 6, the metal line 568 is coupled to a current source if the MTJ stack 710 is configured as a magnetic field sensor. The voltage generated serves as a read-out for monitoring the magnetic field.

Referring back to FIG. 6, the substrate also includes a device region 509 which accommodates one or more logic devices. In the region 509, a metal line is disposed in the metal level (e.g., M5). The metal line may be referred to as a lower interconnect of upper ILD levels in the region 509. The metal line may be coupled to contact regions of logic transistor (not shown) disposed on the substrate. Although one metal line is shown, it is understood that there could be other suitable number of metal lines in the same metal level of the region 509.

As shown in the region 509, the dielectric layer also includes a metal line 562 in the metal level and a via contact 564 disposed in the via level of the dielectric layer. For example, the metal line 562 may be disposed in metal level M6 while the via contact 564 may be disposed in via level V5. Although one metal line 562 is shown, it is understood that there could be other suitable number of metal lines. Suitable electrical signals may be provided to metal line 562 which connects to the logic transistor (not shown) disposed on the substrate.

Although as described, the various lines and MTJ stacks are disposed in specified dielectric levels of the backend dielectric levels, other configurations may also be useful. For example, they may be disposed in other or additional metal levels. For example, the MTJ stacks may be provided in an upper via level, such as between M6 and M7 or in a lower via level such as between M3 and M4. Furthermore, the device may include other additional dielectric layers disposed thereon, such as to form pad level and passivation layers.

FIGS. 10a-10h show simplified cross-sectional views of a process 800 of forming a device along the bitline direction. The device may include multiple MTJ stacks having different configurations, i.e., orientation of the free layer, aspect ratio of the free layer and etc. In one embodiment, the MTJ stacks are configured as memory cells, magnetic field sensors, microwave oscillators and detectors. The process simultaneously forms the multiple MTJ stacks having different configurations on a common substrate. In addition, although the cross-sectional views show only three MTJ stacks are formed, it is understood that the device includes a plurality of MTJ stacks configured as memory cells, magnetic field sensors, microwave oscillators and detectors.

The MTJ stacks, for example, are similar to that described in FIG. 2, FIG. 7 and FIGS. 8a-8c. Common elements may not be described or described in detail. The cross-sectional views, for example, are along the bitline direction (x-axis).

Figure 10A:
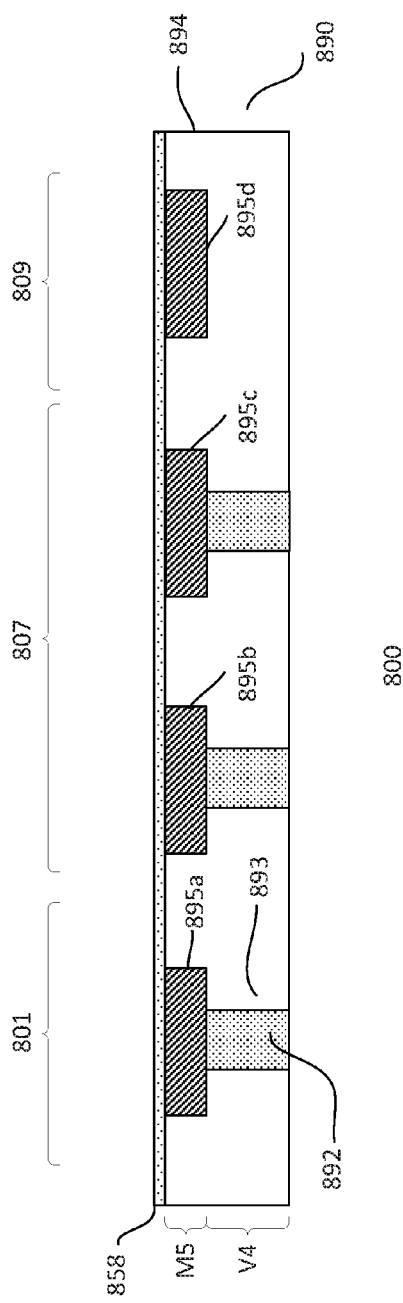
FIGS. 10a-10h show cross-sectional views of an embodiment of a process for forming a device.

FIG. 10a shows a simplified cross-sectional view illustrating a substrate that has been processed with FEOL and BEOL processing, as already described with respect to FIG. 6. The substrate is defined with a cell region 801 for accommodating a memory cell, a device region 807 for accommodating one or more functional devices, such as magnetic sensors and/or magnetic oscillators/detectors and a device region 809 for accommodating one or more logic devices. The substrate includes an upper ILD level 890. FEOL processing, for example, forms transistors, including a select transistor of the memory cell. Other types of devices may also be formed on the same substrate. BEOL processing forms interconnects in ILD levels. The FEOL and part of the BEOL processing will not be illustrated. The substrate, for example, is processed up to the stage where an ILD level which includes and a via level 892 and a metal level 894 is formed. For example, the ILD level includes V4 and M5. The via level V4, for example, includes via contacts 893 while the metal level M5, as shown, includes interconnects. For example, interconnects 895a-895c are metal pads for coupling to MTJ stacks and interconnect 895d is coupled to an upper interconnect. The interconnects, for example, are copper interconnects. Other suitable types of interconnects may also be useful.

A dielectric liner 858, in one embodiment, is disposed above the metal level M5. The dielectric liner, for example, serves as an etch stop layer. The dielectric liner may be a low k dielectric liner. For example, the dielectric liner may be nBLOK. Other types of dielectric materials for the dielectric liner may also be useful. The dielectric liner, for example, is formed by CVD. Other suitable techniques for forming the dielectric liner may also be useful.

Figure 10B:
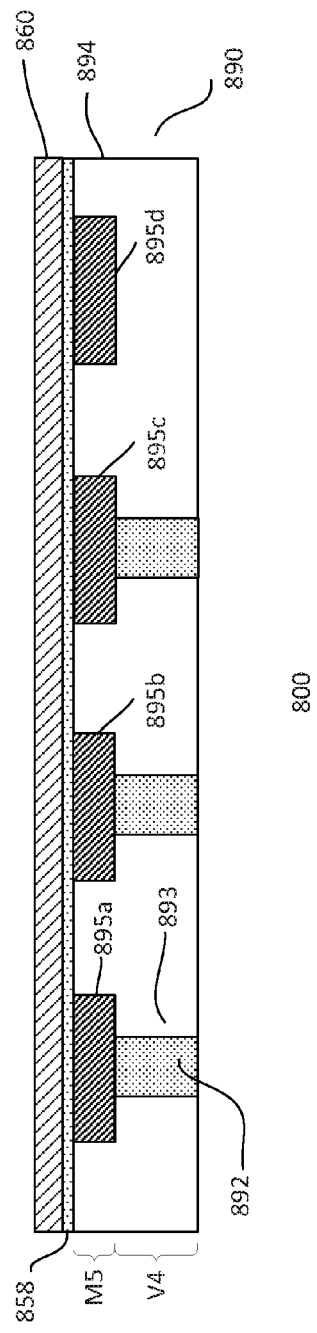

The process continues to form a dielectric layer. As shown in FIG. 10b, a lower dielectric 860 is formed on the dielectric liner 858. The lower dielectric layer, in one embodiment, includes oxide material. The lower dielectric layer may be formed by CVD. Other suitable forming techniques or suitable thicknesses for the lower dielectric layer may also be useful.

Figure 10C:
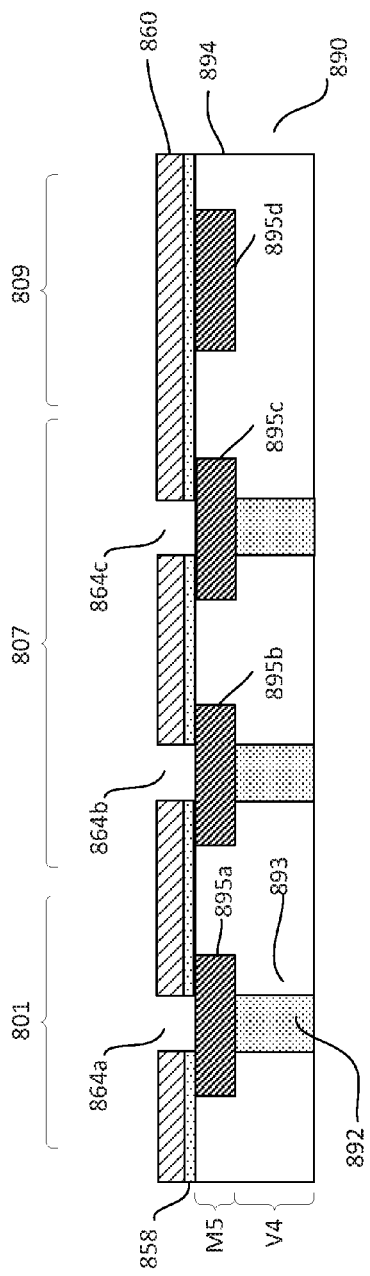

In FIG. 10c, the lower dielectric layer 860 is patterned to form MTJ stack openings 864a-864c. The MTJ opening, for example, is a via opening for accommodating a lower portion of a subsequently formed MTJ stack. The MTJ stack openings expose the contact pads 895a-895c in the metal level below. The openings may be formed by mask and etch techniques. For example, a patterned photoresist mask may be formed over the lower dielectric layer 860, serving as an etch mask. An etch, such as RIE, may be performed to pattern the lower dielectric layer 860 using the patterned resist etch mask. In one embodiment, the etch transfers the pattern of the mask to the lower dielectric layer 860, including the dielectric liner 858 to expose the contact pads 895a-895c below.

Figure 10D:
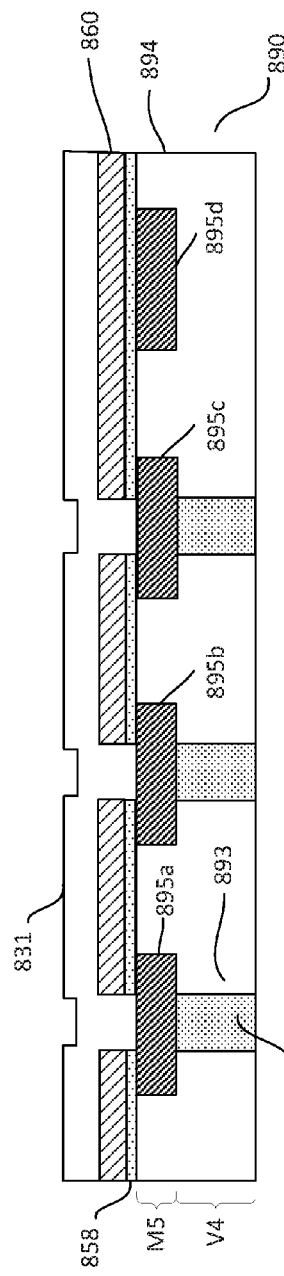

Referring to FIG. 10d, the process continues to form MTJ stacks. The MTJ stacks are, for example, similar to those describe in FIG. 2, FIG. 7 and FIGS. 8a-8c. The MTJ stacks may include various layers configured as bottom pinned MTJ stacks.

The MTJ stacks, for example, include a stack of layers disposed between top and bottom electrodes. The bottom electrode is coupled to a contact pad in the metal level below. For example, the bottom electrode is coupled to the contact pad 895a in M5. This provides connections of the MTJ stacks to the first S/D region of the cell select transistor as described in FIG. 6. As for the top electrode, it is exposed at the top of the dielectric layer.

The various layers of the MTJ stacks are formed on the substrate. For example, the various layers of the MTJ stacks are sequentially formed over the lower dielectric layer 860 and filling the openings 864a-864c.

Figure 10E:
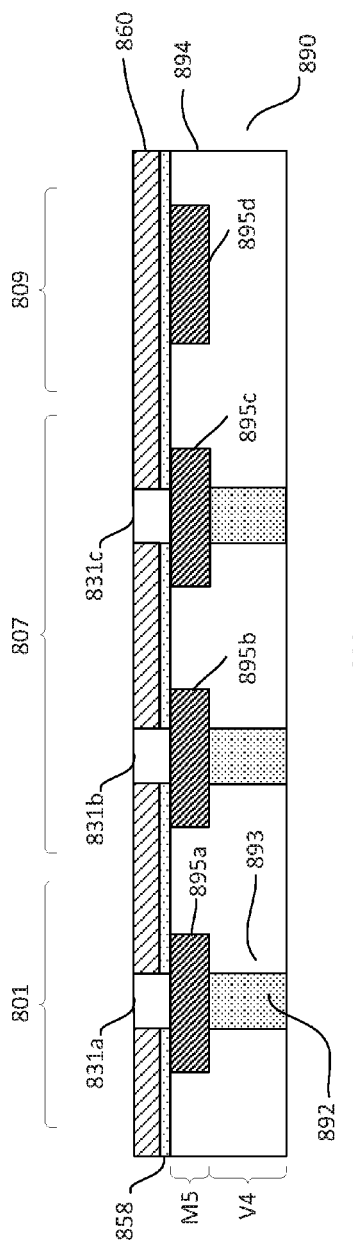

After the openings 864a-864c are formed, a bottom electrode layer 831, such as Ta or TaN, is deposited over the lower dielectric layer 860 and fills the openings as shown in FIG. 10d. A chemical mechanical polishing (CMP) process is applied to form embedded bottom electrodes in the openings 864a-864c and remove excess bottom electrode layer in other areas. Other suitable bottom electrode materials and techniques may be employed. The bottom electrodes 831a-831c fill the openings 864a-864c and the surface is flat as shown in FIG. 10e.

The process continues to sequentially form remaining layers of the MTJ stacks, such as a seed layer, a bias layer, a magnetically fixed (pinned) layer, a tunneling barrier layer, and a free layer on top of the bottom electrode by physical vapor deposition (PVD) process. After forming the layers of the MTJ stacks, a top electrode layer 832, such as Ta or TaN, is deposited over the free layer. At this stage, a first lithography mask which includes a photoresist is used to pattern the free layer 818 and the top electrode layer 832 at a first portion. The first portion is the portion where the MTJ stack of FIGS. 8a-8c is to be formed. The first lithography mask includes a first opening resembling the top view of the free layer 718 of the MTJ stack of FIGS. 8a-8c, when a negative photoresist is used. After patterning the free layer and the top electrode layer at the first portion, a second lithography mask is used to complete the patterning of the MTJ stacks. The second lithography mask includes a second opening to be disposed on the first portion which has been patterned by the first lithography mask. The second lithography mask also includes the second opening to be disposed on a second portion where the MTJ stack of FIG. 2 is to be formed. The second opening resembles the top view of the tunneling barrier layer 716 of the MTJ stack of FIGS. 8a-8c, when a negative photoresist is used. The second opening of the second lithography mask is larger than the first opening of the first lithography mask. The second lithography mask also includes a third opening to be disposed on a third portion where the MTJ stack of FIG. 7 is to be formed. The third opening resembles the top view of the free layer 618 of the MTJ stack of FIG. 7, when a negative photoresist is used. The aspect ratio of the third opening is different from the aspect ratio of the second opening.

Figure 10F:
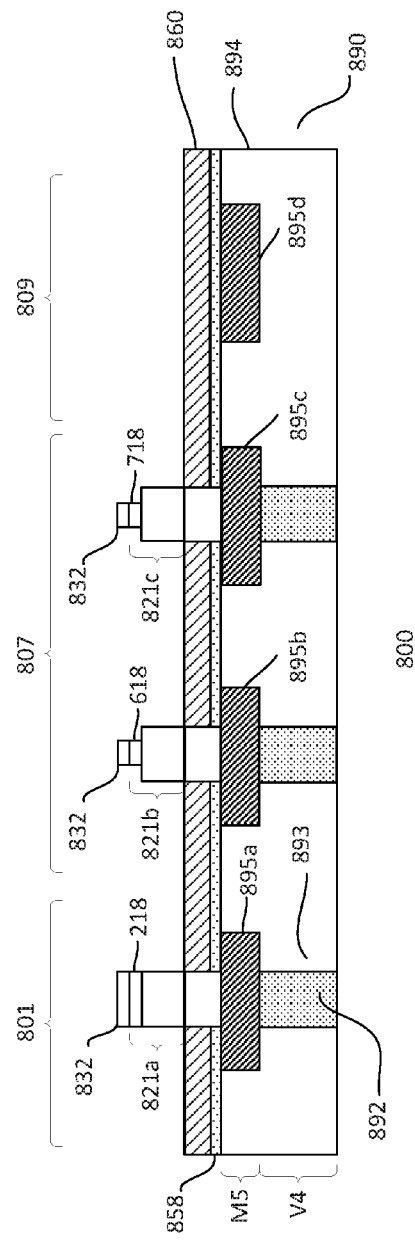

The layers are patterned to form stacks 821a-821c as shown in FIG. 10f. Patterning the layers may be achieved using non-conducting mask and etch techniques. After forming the layers, the non-conducting mask layer used to pattern the stack is removed if dielectric ARC or oxide hard mask layer is used. Other suitable techniques for removing the mask layer may also be useful.

The MD stack 821a may be configured as a STT-MRAM having a free layer 218, while the MTJ stack 821b having a free layer 618 and MTJ stack 821c having a free layer 718 may be configured as a microwave oscillator and magnetic field sensor, respectively. The free layer of the MTJ stack 821c is formed by the first lithography mask having the first opening, and the rest of the layers of the MTJ stack 821c are formed by the second lithography mask having the second opening. The free layer of the MTJ stack 821c is perpendicular to the rest of the layers of the MTJ stack 821c in the plane of the substrate surface. For example, the free layer is rotated at about 90° with respect to the rest of the layers of the MTJ stack 821c. The free layer of the MTJ stack 821a is patterned simultaneously with the rest of the layers of the MTJ stack 821a using the second lithography mask having the second opening. Similarly, the free layer of the MTJ stack 821b is patterned simultaneously with the rest of the layers of the MTJ stack 821b using the second lithography mask having the third opening.

The free layer 218 and free layer 618 are perpendicular to the free layer 718 in the plane of the substrate surface. The MTJ stacks 821a and 821b are in the same direction as the MTJ stack 821c, apart from the free layer 718 of the MTJ stack 821c which is rotated at about 90° with respect to the underlying layers, including the tunneling barrier layer and the fixed layer. For example, the long axes of the MTJ stacks 821a and 821b are aligned in the same direction of the same plane, and the short axes of the MTJ stacks 821a and 821b are aligned in the same direction of the same plane. The long axis of the layers of the MTJ stack 821c, apart from the free layer, is aligned with the long axis of the MTJ stacks 821a and 821b. Similarly, the short axis of the layers of the MTJ stack 821c, apart from the free layer, is aligned with the short axis of the MTJ stacks 821a and 821b in the same direction of the same plane. The long axis of the free layer 718 is perpendicular to the long axis of the free layers 218 and 618, and aligned with the short axis of the free layers 218 and 618 in the same plane. Similarly, the short axis of the free layer 718 is perpendicular to the short axis of the free layers 218 and 618, and aligned with the long axis of the free layers 218 and 618 in the same plane.

Figure 10G:
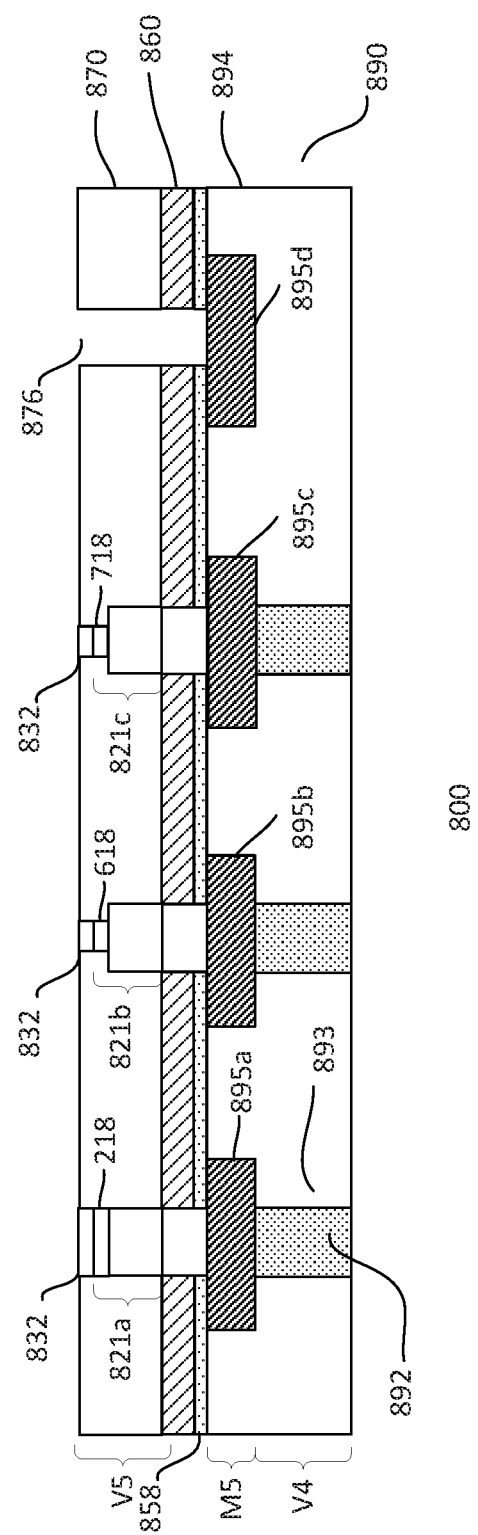

An intermediate dielectric layer 870 is formed on the substrate, as shown in FIG. 10g. The dielectric layer is formed over the lower dielectric layer and sufficiently covers the MTJ stacks 821a-821c. The intermediate dielectric layer, for example, is silicon oxide. Other types of intermediate dielectric layers may also be useful. The intermediate dielectric layer may be formed by CVD. Other techniques for forming the dielectric layer may also be useful.

A planarizing process is performed on the substrate, planarizing the intermediate dielectric layer. The planarizing process, for example, is a CMP process. The CMP produces a planar top surface between the top of the MTJ stacks and intermediate dielectric layer.

The intermediate and lower dielectric layers and the dielectric liner are patterned to form a via opening 876 at the logic region. The via opening is patterned by mask and etch techniques. The via opening penetrates through the various dielectric layers. This exposes the interconnect 895d in the lower metal level. After forming the via opening, the mask layer is removed. For example, the mask and ARC layers are removed.

Figure 10H:
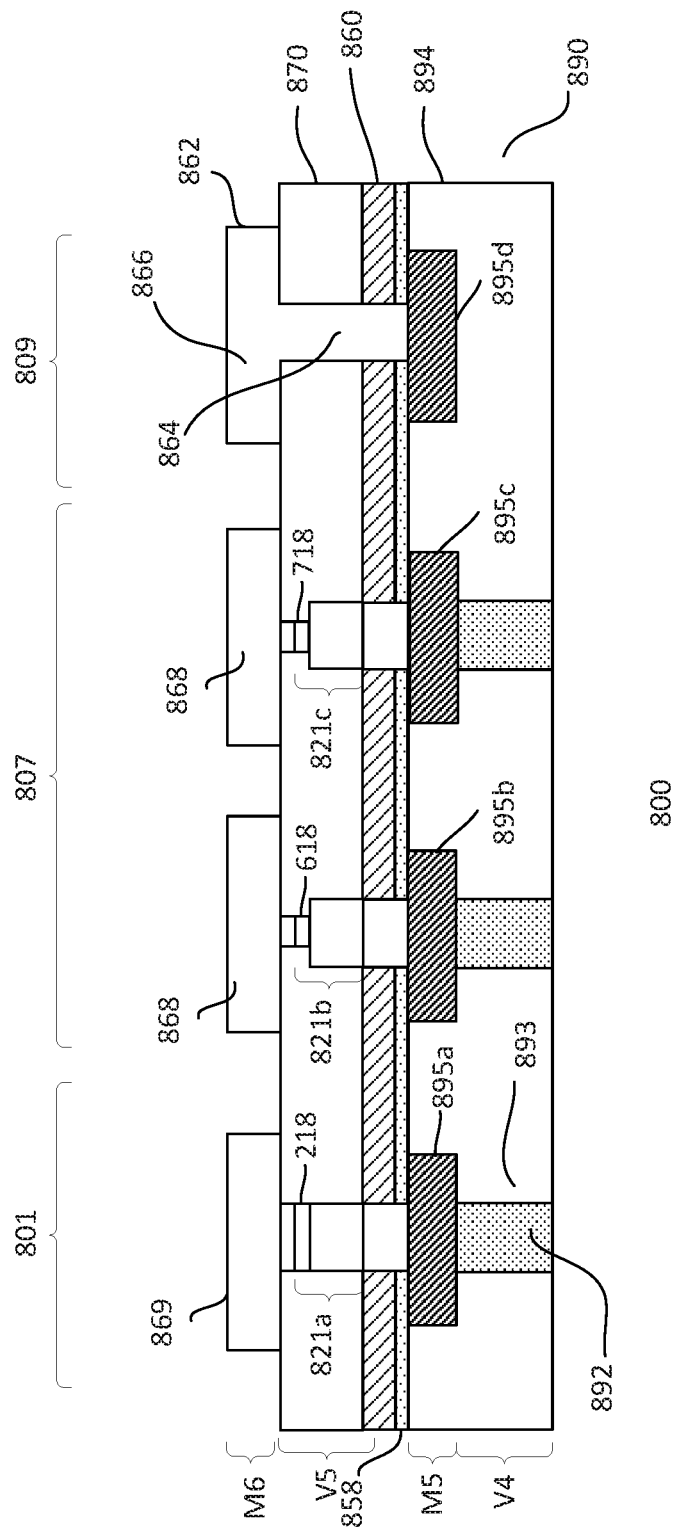

Referring to FIG. 10h, a conductive layer is formed on the substrate. The conductive layer covers the intermediate dielectric layer and MTJ stacks as well as filling the via opening. In one embodiment, the conductive layer is a copper layer. For example, the copper layer is used to form metal line and/or interconnect pads. Other suitable types of conductive layers may also be useful. The conductive layer may be formed by, for example, sputtering. Other suitable techniques for forming the conductive layer may also be useful.

The conductive layer is patterned to form metal lines 868-869 and interconnect 862. Patterning the conductive layer to form the metal lines and interconnect may be achieved by mask and etch techniques. For example, a patterned photoresist mask may be formed over the conductive layer. An etch, such as RIE, may be used to pattern the conductive layer with a patterned resist mask. In one embodiment, the interconnect 862 in region 809 includes a via contact 864 in the via opening and a contact pad 866. The metal line 869 in the cell region 801, in one embodiment, serves as the bitline BL while the metal line 868 in region 507 is coupled to other logic functional block such as dc current source, input stage of RF circuitry, depending on applications. After patterning the conductive layer, the mask layer is removed. For example, the mask and ARC layers are removed.

Additional processes may be performed to complete forming the device. For example, the processes may include forming additional ILD levels, pad level, passivation level, pad opening, dicing, assembly and testing. Other types of processes may also be performed.

The embodiments as described result in various advantages. For example, memory cell and one or more spintronic functional circuits, such as magnetic field sensor and/or oscillator/detector, are formed concurrently on the same substrate using logic processing without compromising the reliabilities of the memory cell, the functional circuits and other components in the logic region on the same substrate. As described, the various spintronic functional components are integrated with the memory cell by changing the shape and parameters of the MTJ stacks. The various MTJ stacks may be formed simultaneously and configured accordingly to perform the desired applications. This simplifies the manufacturing process and provides a cost saving solution. Moreover, the process as described is highly compatible with logic processing or technology. This avoids the investment of new tools and does not require additional or new masks, providing a cost effective solution.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate comprising circuit component formed on a substrate surface;
   performing back end of line processing to form an upper inter level dielectric (ILD) layer over the substrate, wherein the upper ILD layer comprises a plurality of ILD levels; and
   forming a plurality of magnetic tunneling junction (MTJ) stacks in between adjacent ILD levels of the upper ILD layer, wherein the plurality of the MTJ stacks comprise
   a first MTJ stack having a first free layer, a first tunneling barrier layer and a first fixed layer, wherein the first free layer is perpendicular to the first tunneling layer and fixed layer in the plane of the substrate surface, and
   a second MTJ stack having a second free layer, a second tunneling barrier layer and a second fixed layer, wherein the first free layer is perpendicular to the second free layer in the plane of the substrate surface.

2. The method of claim 1, wherein:
   the first free layer comprises a first long axis and a first short axis;
   the second free layer comprises a second long axis and a second short axis; and
   the first long axis is aligned with the second short axis and the first short axis is aligned with the second long axis.

3. The method of claim 1 wherein the plurality of the MTJ stacks further comprise:
   a third MTJ stack having a third free layer, a third tunneling barrier layer and a third fixed layer.

4. The method of claim 3 wherein:
   the second free layer comprises a second long axis and a second short axis;
   the third free layer comprises a third long axis and a third short axis; and
   a first aspect ratio is defined by $AR_1$ which is equal to second long axis/second short axis and a second aspect ratio is defined by $AR_2$ which is equal to third long axis/a third short axis.

5. The method of claim 4 wherein the second long axis is different from the third long axis and the second short axis of the second free layer is different from the third short axis.

6. The method of claim 5 wherein $AR_1$ is about 2 to 3 and $AR_2$ is about 1 to 3.

7. The method of claim 1 wherein forming the plurality of MTJ stacks in between adjacent ILD levels comprises:
   forming a plurality of openings in a lower dielectric layer of a lower ILD level of the adjacent ILD levels;
   forming a bottom electrode layer over the lower dielectric layer and fills the openings;
   planarizing the bottom electrode layer to form bottom electrodes in the openings and removing excess bottom electrode layer in areas other than the openings;

depositing remaining MTJ stack layers over the lower dielectric layer and the bottom electrodes; and patterning the remaining MTJ stack layers to form a plurality of MTJ stacks and a top electrode of the MTJ stacks over the bottom electrodes.

8. The method of claim 7 where depositing the remaining MTJ stack layers comprises sequentially depositing a fixed layer, a tunneling barrier layer, a free layer and a top electrode layer over the lower dielectric layer and the bottom electrodes.

9. The method of claim 8 wherein patterning the remaining MTJ stack layers comprises:

patterning a first portion of the top electrode layer and free layer using a first mask having a first opening, wherein patterning the first portion forms the first free layer and a first top electrode; and patterning the patterned first portion and a second portion of the top electrode layer and free layer using a second mask having a second opening, wherein patterning of the patterned first portion forms the first MTJ stack having the first top electrode, and patterning of the second portion forms the second MTJ stack having a second top electrode.

10. The method of claim 9 wherein the second opening is larger than the first opening.

11. The method of claim 10 further comprising patterning a third portion of the top electrode layer and free layer using the second mask having a third opening during the patterning of the patterned first portion and the second portion, wherein patterning of the third portion forms a third MTJ stack having a third free layer, a third tunneling barrier layer, a third fixed layer a third top electrode.

12. The method of claim 11 wherein the second free layer has a second aspect ratio and the third free layer has a third aspect ratio, wherein the first aspect ratio is different from the third aspect ratio.

13. The method of claim 11 comprising:

forming an intermediate dielectric layer over the lower dielectric layer and covers the patterned MTJ stacks; and performing a planarizing process to form planar top surface between top of the MTJ stacks and the intermediate dielectric layer.

14. The method of claim 13 further comprising forming first, second and third metal lines over the intermediate dielectric layer, wherein the first, second and third metal lines are coupled to the respective first, second and third MTJ stacks.

15. A device comprising:

a substrate comprising circuit component disposed over a substrate surface;

an upper inter level dielectric (ILD) layer disposed over the substrate, wherein the upper ILD layer comprises a plurality of ILD levels; and a plurality of magnetic tunneling junction (MTJ) stacks disposed in between adjacent ILD levels of the upper ILD layer, wherein the plurality of the MTJ stacks comprise a first MTJ stack having a first free layer, a first tunneling barrier layer and a first fixed layer, wherein the first free layer is perpendicular to the first tunneling layer and fixed layer in the plane of the substrate surface, and a second MTJ stack having a second free layer, a second tunneling barrier layer and a second fixed layer, wherein the first free layer is perpendicular to the second free layer in the plane of the substrate surface.

16. The device of claim 15, wherein the first free layer comprises a first long axis and a first short axis;

the second free layer comprises a second long axis and a second short axis; and the first long axis is aligned with the second short axis and the first short axis is aligned with the second long axis.

17. The device of claim 15 further comprising a third MTJ stack having a third free layer, a third tunneling barrier layer and a third fixed layer.

18. The device of claim 17 wherein the second free layer has a first aspect ratio and the third free layer has a second aspect ratio.

19. The device of claim 15 wherein the first MTJ stack and the second MTJ stack have similar thicknesses.

20. The device of claim 18 wherein the first aspect ratio is different from the second aspect ratio.

* * * * *